United States Patent [19]
Taylor

[11] Patent Number: 5,978,293
[45] Date of Patent: Nov. 2, 1999

[54] CIRCUITRY AND METHODS FOR DYNAMICALLY SENSING OF DATA IN A STATIC RANDOM ACCESS MEMORY CELL

[75] Inventor: Ronald T. Taylor, Grapevine, Tex.

[73] Assignee: Cirrus Logic, Inc.

[21] Appl. No.: 09/045,757

[22] Filed: Mar. 19, 1998

[51] Int. Cl.⁶ ................................................. G11C 7/02
[52] U.S. Cl. .......................... 365/207; 365/205; 365/208
[58] Field of Search .................................... 365/207, 205, 365/208, 189.05

[56] References Cited

U.S. PATENT DOCUMENTS

| | | | |
|---|---|---|---|
| 5,619,466 | 4/1997 | McClure | 365/207 |
| 5,751,649 | 5/1998 | Kornachuk et al. | 365/205 |
| 5,831,919 | 11/1998 | Haunkess et al. | 365/205 |
| 5,859,794 | 1/1999 | Chan | 365/208 |

*Primary Examiner*—Huan Hoang
*Attorney, Agent, or Firm*—James J. Murphy, Esq.; J. P. Violette, Esq.

[57] ABSTRACT

A sense amplifier sensing data on a pair of complimentary half-bitlines 301*a*, 301*b* connected to a static random access memory cell 300. First and second sensing transistors 405*a*, 405*b* amplify a voltage difference between first and second half-bitlines 301 during an active cycle. First and second restore transistors 404*a*, 404*b* pull the first and second half-bitlines to corresponding first and second voltage rails in response to the amplified voltage difference. SR Latch 406, 407 retains data from cycle to cycle.

18 Claims, 4 Drawing Sheets

CIRCUITRY AND METHODS FOR DYNAMICALLY SENSING OF DATA IN A STATIC RANDOM ACCESS MEMORY CELL

BACKGROUND OF THE INVENTION

1. Field of the Invention

The present invention relates in general to electronic memories and in particular, to circuitry and methods for dynamically sensing data in a static random access memory cell.

2. Description of the Related Art

Static random access memory cells (SRAMs) are useful in applications such as cache memory, where speed is a more critical consideration than power consumption and cell size. SRAM memory can be in the form of a discrete device, such as the L2 cache in a processing system, or be embedded within a larger processing device, such as the L1 cache found on-board many microprocessors. Even though speed is the most critical factor, reduced power consumption and noise minimization are always a major concern for the designers of SRAMs and in particular of embedded SRAM design.

One area where power consumption and noise become a particular problem is in the sense amplifier design. Recent trends in embedded high-speed CMOS SRAM memory design have made the traditional analog amplifier sensing schemes less attractive. Among other things, when traditional SRAM amplifiers are outputting data, the DC power consumption rapidly increases. In fact, the sense amplifier power consumption can often represent most of the overall SRAM power consumption. Additionally, traditional SRAM sense amplifiers produce system noise in the form of output switching transients. Not only do these output switching transients create signal transmission problems but, if the outputs of a large number of sense amplifiers are switching, they can also increase power consumption.

Thus, the need has arisen for new SRAM sensing circuitry and methods for constructing low power consumption, low noise SRAMs.

SUMMARY OF THE INVENTION

According to the teaching of the present invention, a dynamic sense amplifier is disclosed for sensing data on a pair of complementary half-bitlines coupled to a static random access memory cell. First and second sensing transistors are included for amplifying a voltage difference between the first and second half-bitlines during an active cycle. First and second restore transistors pull the first and second half-bitlines to corresponding first and second voltage rails in response to the amplified voltage difference.

According to further teachings of the present invention, a static random access memory sense amplifier is disclosed. Isolation circuitry is provided for isolating the sense amplifier during a pre-charge cycle, coupling sense amplifier for static random access memory cell during an active cycle. A precharge circuitry is included for precharging first and second sensing nodes during precharge cycle. Sensing circuitry senses data output from the static random access memory cell during the active cycle while restore circuitry restores the data to full digital voltage levels. An output latch stores data from a previous active cycle, the latch changing state only when the data output from the memory differs from the data stored from a previous cycle.

Other teachings of the present invention are also embodied in memories including an array of rows and columns of static random access memory cells, each column of cells associated with a pair of conductive half-bitlines for accessing data from a selected row. A sense amplifier is coupled to each pair of conductive half-bitlines which includes first and second sensing nodes for following a voltage presented on respective ones of the pair of half-bitlines in precharge circuitry for charging the first and second sensing nodes during a precharge cycle. Each sense amplifier further includes sensing circuitry for sensing a voltage difference appearing between the first and second sensing nodes, the voltage difference representing data, and restore circuitry for pulling the first and second sensing nodes toward selected voltage rails. An output latch is included with each sense amplifier for storing data from a previous active cycle, the output latch changing state when the data differs from the data from the previous cycle.

The principles of the present invention are also embodied in methods of dynamically sensing data stored in a static random access memory cell. First and second sensing nodes are precharged to a predetermined voltage in response to a precharge signal. The first and second nodes and coupled with respective first and second half-bitlines, coupled to the memory cell, in response to a isolation signal. The voltage difference between the sensing nodes is sensed, the voltage difference representing data. The data is presented to a latch, the latch changing state when the data differs from data previously stored in the latch.

The teachings of the present invention provide substantial advantages over the circuits and methods previously used to sense data stored in a static random access memory cell. Among other things, these teachings allows for the construction and operation of dynamic SRAM sense amplifiers which substantially reduce or eliminate the DC power consumed by conventional SRAM sense amplifiers, reduce the AC power consumed by the output drivers, and substantially reduce the output switching noise.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

The principles of the present invention and their advantages are best understood by referring to the illustrated embodiment depicted in FIGS. 1–5 of the drawings, in which like numbers designate like parts.

Figure 1:
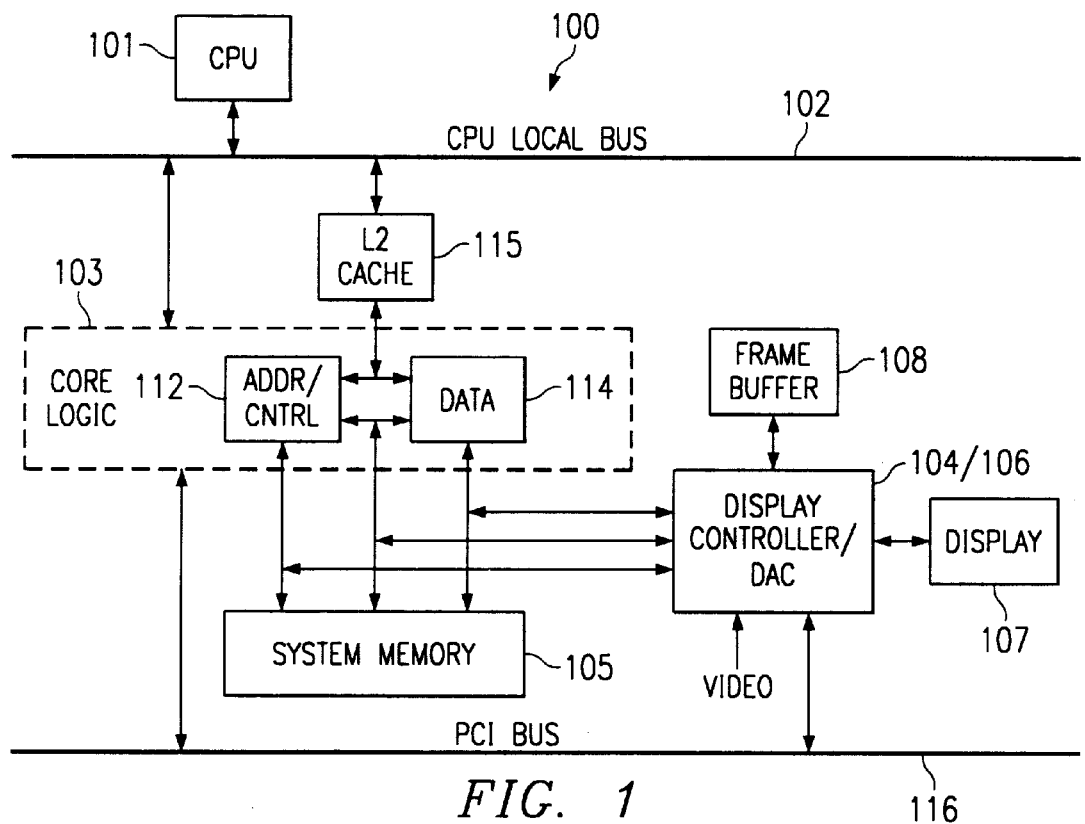
FIG. 1 is a high level functional block diagram of portion of a processing system typically used in personal computers.

FIG. 1 is a high level functional block diagram of portion of a processing system 100. System 100 includes a central processing unit 101, a CPU local bus 102, core logic 103, a display controller 104, a system memory 105, a digital to analog converter (DAC) 106, frame buffer 108, a display device 107 and peripheral bus 116.

CPU 101 is the "master" which controls the overall operation of system 100. Among other things, CPU 101 performs various data processing functions and determines the content of the graphics data to be displayed on display unit 107 in response to user commands and/or the execution of application software. CPU 101 may be for example a general purpose microprocessor, such as an Intel Pentium™ class microprocessor or the like, used in commercial personal computers. CPU 101 communicates with the remainder of system 100 via CPU local bus 102, which may be for example a special bus, or a general bus. As discussed further below, bus 102 may be used to implement the novel memory interface of the present invention.

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system, and in particular with CPU 101. According to the principles of the present invention, core logic 103 is modified in hardware or programmed by software or firmware to interface with a system memory 105. System memory 105 is constructed preferably from dynamic random access memory (DRAM) devices, although for some embodiments, the SRAM memory devices described below can also be used. One or more core logic chips, such as chip 112 in the illustrated system, are typically "address and system controller intensive" while one or more core logic chips, such as chip 114 in FIG. 1, are "data intensive." Address intensive core logic chip 112 generally: interfaces CPU 101 with the address path of CPU bus 102; maintains cache memory, including the cache tags, set associative cache tags and other data necessary to insure cache coherency; performs cache "bus snooping"; generates the control signals required for DRAMs in the system memory or cache; and controls general management transactions. Data intensive chip 114 generally: interfaces CPU 101 with the data path of CPU bus 102; issues cycle completion responses to address chip 112 or CPU 101; and may abort operations if their cycles are incomplete; and arbitrates for the data path of bus 102.

CPU 101 can directly communicate with core logic 103 or through an external (L2) cache 115. L2 cache 115 may be for example a 256 K Byte fast SRAM device(s). It should be noted that CPU 101 can also include on-board (L1) cache, typically up to 16 kilobytes. The principles of the present invention can be applied to either the construction and operation of the discrete L2 cache or the embedded L1 cache.

Display controller 104 may be any one of a number of commercially available VGA display controllers. Display controller 104 may receive data, instructions and/or addresses from CPU 101 through core logic 103. Data, instructions, and addresses are exchanged between display controller 104 and system memory 105 through core logic 103. Further, addresses and instructions may be exchanged between core logic 103 and display controller 104 via a peripheral (local) bus 116 which may be for example a PCI local bus.

Generally, display controller 104 controls screen refresh, executes a limited number of graphics functions such as line draws, polygon fills, color space conversion, display data interpolation and zooming, and video streaming, and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data needed to drive display 107. In the illustrated embodiment, DAC 106 is integrated with display controller 104 onto a single chip. Depending on the specific implementation of system 100, the display controller 104 may also include a color palette, YUV to RGB format conversion circuitry, and/or X- and Y-zooming circuitry, to name a few options. Displays 107 may be for example a CRT unit, a liquid crystal display, electroluminescent display, plasma display, or other type of display device which displays images on a screen as a plurality of pixels. It should also be noted that in alternate embodiments, "display" 107 may be another type of output device such as a laser printer or similar document view/print appliance.

Figure 2:
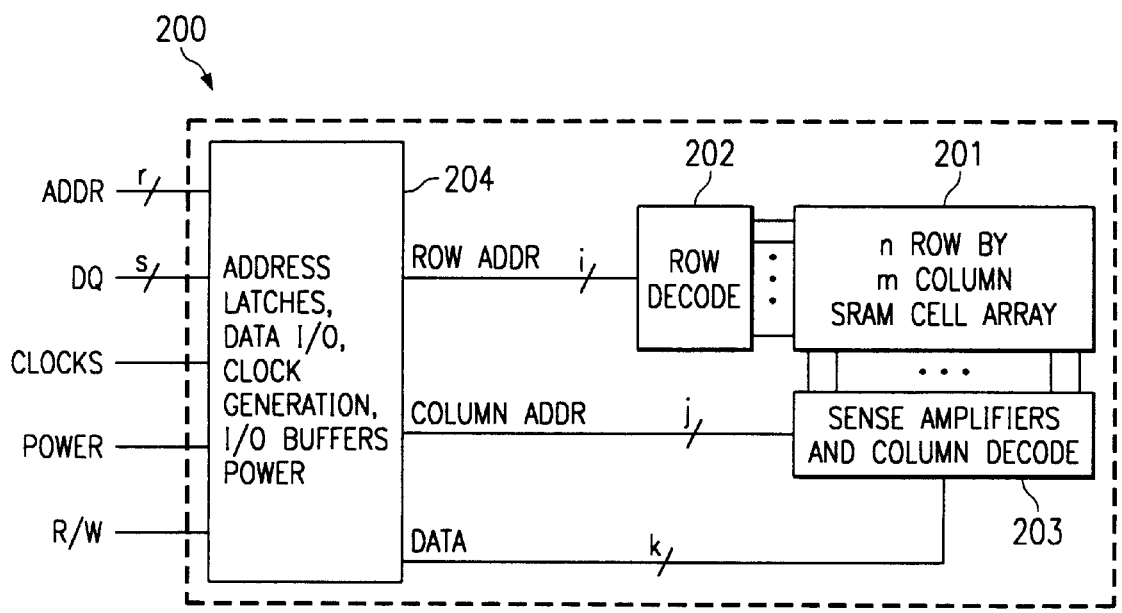
FIG. 2 is a high level functional block diagram of a static random access memory suitable for such applications as the construction of the L2 cache memory depicted in FIG. 1 or the embedded cache on the CPU depicted in FIG. 1.

FIG. 2 is a high level functional block diagram of a memory 200 suitable for such applications as the construction of L2 cache memory 115 or the embedded cache on CPU 101. Memory 200 includes an array 201 of m number of rows and n number of columns of SRAM cells. Preferably, these SRAM cells are conventional in nature. A row of cells in array 201 is selected in response to a received row address by row decoder 202 which activates a conductive wordline (WL) coupled to the cells of the selected row. Each column of cells is associated with a pair of half-bitlines formed by complimentary half-bitlines (BT and BC). The bitlines are each coupled to column decoder-sense amplifier circuitry 203. This structure will be discussed in detail below. During a read, the data from an entire row of cells are sensed and subsequently column decoder circuitry of block 203, in response to a received column address, selectively passes a set of the desired data to the device I/O circuitry in blocks 203 and 204. During a write, data is presented on selected bitlines through column decoder 203 and latched into the corresponding SRAM cells in response to an active wordline of the selected row.

I/O block 204 generally includes the traditional I/O and control circuitry such as, address latches, read/write (R/W) select and clock generation circuitry. In the illustrated embodiment, a non-multiplexed address bus is coupled to port ADDR through which row and column addresses are concurrently input. Data are input and output of data through the data port DQ.

Figure 3:
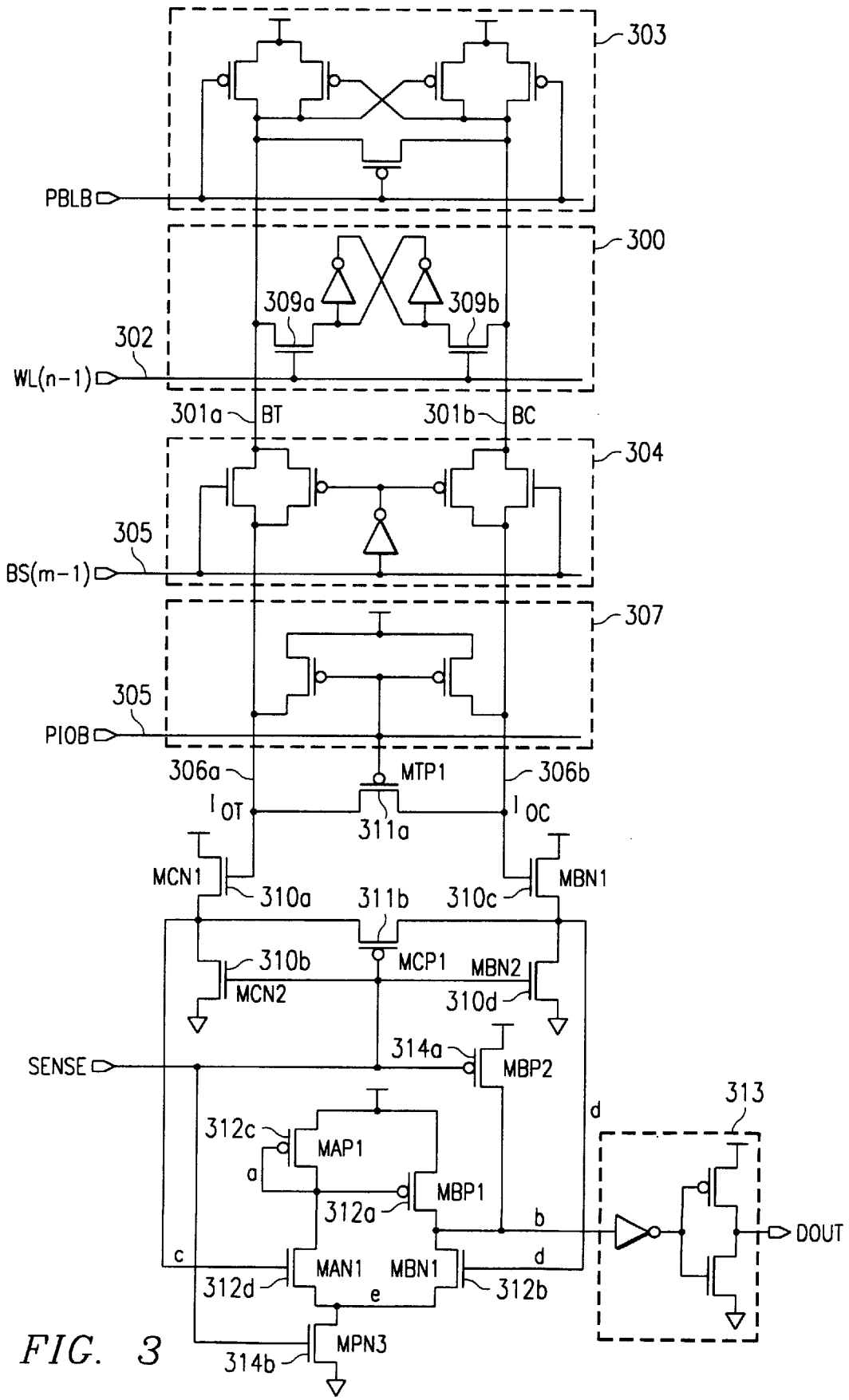
FIG. 3 is an electrical schematic of typical static random access memory (SRAM) cell and associated accessing circuitry of the corresponding column in the array of FIG. 2.

FIG. 3 is an electrical schematic of typical static random access memory (SRAM) cell 300 of n similar cells along a selected column in array 200. Also shown is the sensing and other peripheral circuitry associated with the selected column, most of which is disposed generally in blocks 203 and 204. This circuitry will be described in detail in the following discussion.

Each of the memory cells along the column, including exemplary cell 300, are coupled to a true half-bitline (BT) 301a and complement half-bitline (BC) 301b (collectively a bitline 301). Each of the m memory cells along a given row in array 201 are coupled to a wordline (WL) 302. In normal operation one and only one of the m wordlines WL(0)–WL(n−1) is active to connect memory cells 300 of the associated row to the corresponding bitlines 301. In FIG. 3, exemplary cell 300 is shown coupled to wordline WL(n−1). Associated with each bitline 301 (column) are precharge/load MOSFETs 303 controlled by bitline precharge signal PBLB. These MOSFETs operate in a conventional manner.

In a typical SRAM only one bitline 301 in an array can be accessed for read or write purposes at any given time. Consequently bitline select circuitry 304 is provided to select one bitline 301 from the array of m bitlines. Typically one of a group of bitline select lines BS(0)–BS (m−1) 305 (in FIG. 3, bitline select line BS(m−1) is shown) selectively couple one of the m bitlines 301 to a common I/O line pair 306a, 306b (labelled in FIG. 3 IOT and IOC respectively). Similar to the bitlines, I/O lines 306 are usually coupled to precharge/load MOSFETs 307 and 311a controlled by an I/O line precharge signal (PIOB) which operates in the traditional manner.

Since the drive strength of the memory cell access MOSFETs (309a, 309b in memory cell block 300) is small and the capacitance of bitline 301 is large, the voltage change on bitline 301 during a read operation is very slow compared to normal digital logic switching delays. For this reason high speed SRAMs have differential amplifiers capable of detecting a small voltage on the bitlines 301 (and I/O lines 306 as well) and outputting a digital logic level from the SRAM. Nodes a–d in FIG. 3 and their associated MOSFETs perform this function in the typical SRAM. Specifically, MOSFETs 312a–312d and 314b form a classical differential amplifier operating on the voltages at nodes a, b, c, d and e. A small differential voltage signal input presented on nodes c and d will result in an approximately rail to rail digital signal being output on node b. The output voltage will be a positive logic 1 if the node c voltage is greater than the node d voltage. A positive logic 0 will be output when the node c voltage is less than the node d voltage.

This differential amplifier approach suffers from a number of problems. Among other things, the voltage gain of differential amplifier of the type shown in FIG. 1 is very sensitive to the average value of the voltages on nodes c and d. Additionally, the voltage supplied by the bitline 301 is too high for optimum performance of the amplifier. Additional circuitry is therefore required to increase drive and optimize performance. In this example, MOSFETs 310a–310d (labeled MCN1, MCN2, MBN1 and MBN2 respectively) reduce (level shift) the bitline voltages down by one N channel threshold voltage ($V_{tn}$) in the traditional manner. This requires precharge of nodes c and d by a MOSFET 311b (MCP1). Finally, in optimizing MOSFETs 312a and 312b (MBP1 and MBN1) for precise voltage amplification, limits drive strength. Data out circuitry 313 is therefore added to increase the drive strength of the digital signal on node b.

In addition to the additional circuitry discussed above, the differential amplifier approach also is subject to operational drawbacks. Foremost is DC power consumption, which in the case of the circuit in FIG. 3 occurs whenever output data is valid (i.e. logic high). In fact, at low clock (sense) frequencies sense amplifier DC power consumption comprises the majority of the power consumed by the SRAM. In conventional SRAMs a latch is added to data output circuitry 313 allowing the sense amplifier to be powered down after data has been read. Even with this technique, however, the power consumption problem is severe, particularly on wide word SRAMs (16 I/O pins or more) where multiple arrays must be operated simultaneously to drive the multiple I/O pins.

A second problem is system noise caused by output switching transients. In the circuit shown in FIG. 3 the output pin (DOUT) goes to a logic 1 whenever the amplifier is in the precharge state. If large numbers of similar outputs do this simultaneously, substantial noise is generated and significant power may be consumed by spurious transients. This problem also may be minimized by the addition of an output latch and its associated clocks, but the construction of the necessary control circuitry becomes extremely complex if a severe read access time penalty is to be avoided.

The principles of present invention substantially reduce or eliminate the DC power consumed by the sense amplifiers, reduce the AC power consumed by the bitlines, reduce AC power consumed by the output drivers, and substantially reduce the output switching noise. In the illustrated embodiment, the level shifter (MOSFETs 310a–310d), precharge transistor 311b and the differential amplifier circuitry (MOSFETs 312a–312d and 314b) in FIG. 3 are replaced with the circuitry shown in FIG. 4 to realize these advantages.

Figure 4:
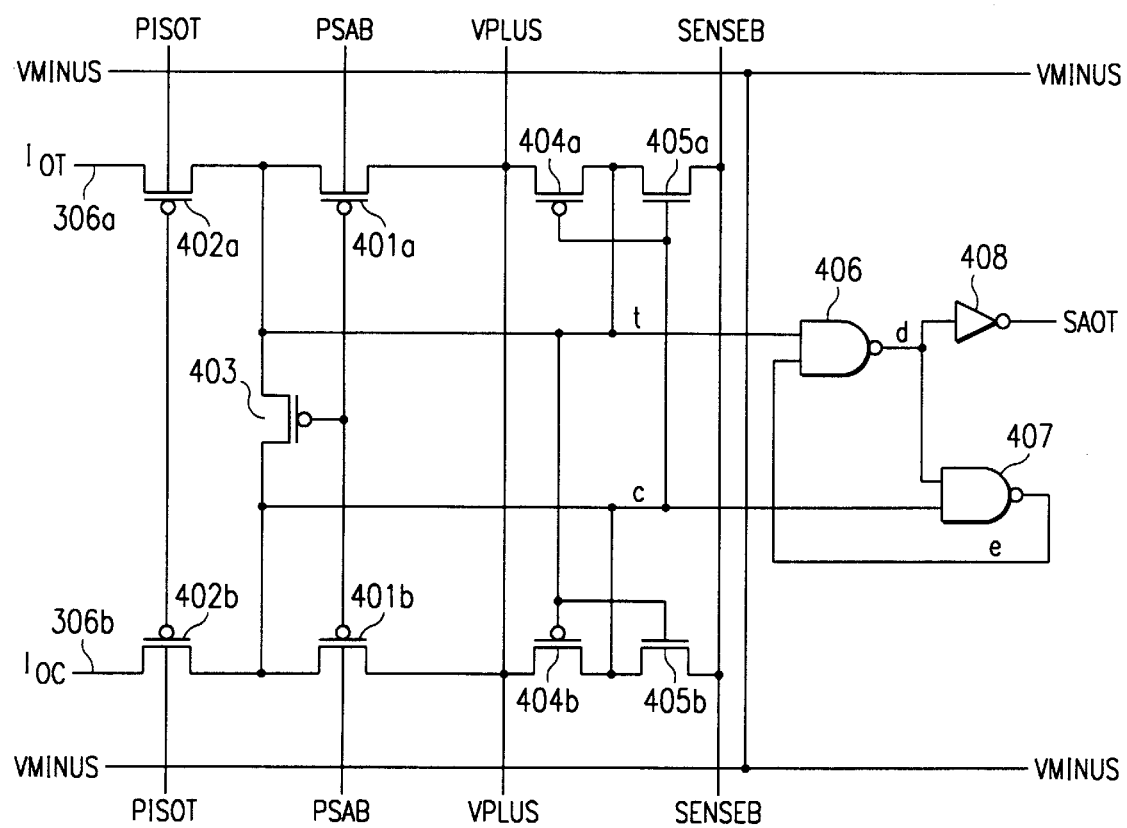
FIG. 4 is an electrical schematic drawing of a dynamic SRAM sense amplifier circuitry according to the present inventive teachings.
Figure 5:
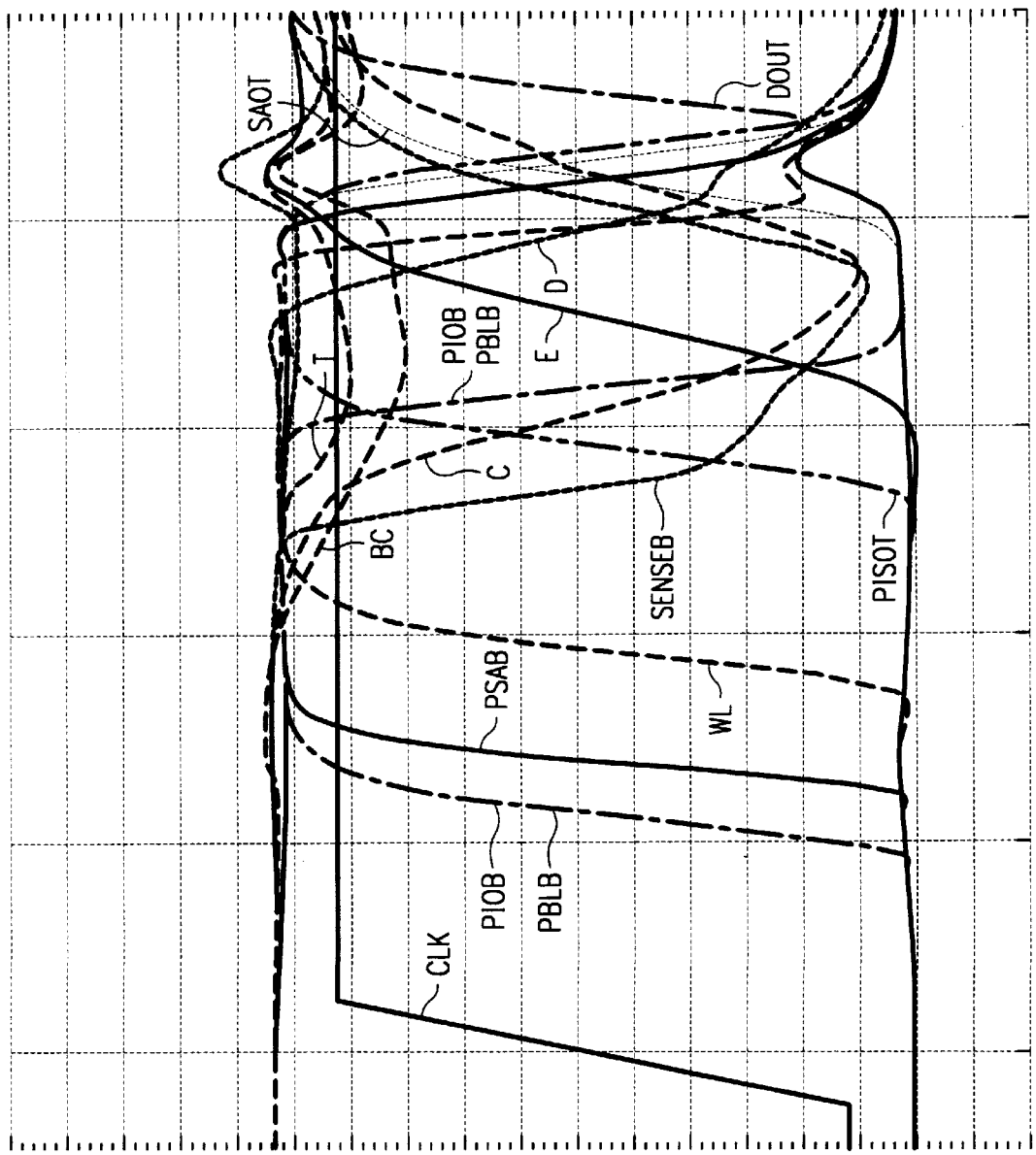
FIG. 5 is a timing diagram illustrating the operation of the sense amplifier circuitry of FIG. 4.

The circuitry of FIG. 4 can best be described in conjunction with the timing diagram of FIG. 5. Bitlines 301 and I/O lines IOT and IOC3 (306a, 306b, FIG. 3) are precharged to the positive supply voltage (VPLUS) when precharge clocks PBLB and PIOB are in the low state. Additionally sense amplifier nodes t and c are precharged to VPLUS through p-channel transistors 401a and 401b and equalized by MOSFET 403 in response to the low state of the sense amplifier precharge clock PSAB (FIG. 4).

During precharge, wordlines 302 and isolation clock (PISOT) are in the low state and the sense clock SENSEB is in the high state. Consequently, isolation transistors 402a and 402b are turned-on to connect I/O nodes 306 and sensing nodes t and c. With SENSEB in a high state, sensing transistors 405a and 405b are turned-off. In the precharge state therefore, there are no DC current paths and bitlines 301, I/O lines 306, and sense amplifier nodes t and c can be precharged identically to VPLUS.

Gates 406 and 407 form a classic NAND-type SR latch and will retain information (node d high or node e high) while the SRAM is in precharge. This information (amplified by inverter 408 and the DATAOUT circuit 313 of FIG. 3 are the output data of the SRAM.

As shown in FIG. 5, the rising edge of the clock (CLK) initiates a chain of events that access data from the SRAM. The SRAM is removed from precharge by switching PBLB, PIOB and PSAB to the inactive (high) state. A wordline (WL) 302, for example WL(n−1) of FIG. 3 is then switched to the active (high) state and one of the bitline nodes 301, assume for discussion node 301b (BC) in FIG. 3, begins a slow transition to the low state in response to the memory cell 300 read current. Sense amplifier node c (FIG. 4) follows node BC due to current flowing in the corresponding decoder MOSFETs 304 and MOSFET 402b.

When a large enough voltage difference (approximately 200 mv in the example) has developed between sense amplifier nodes c and t, the sense clock (SENSEB) is switched to the active (low) state. MOSFETs 405a and 405b now act in the same manner as the sense amplifier in a dynamic random access memory (DRAM). Similarly MOSFETs 404a and 404b now perform the function of the restore circuit in a DRAM.

The node with lowest voltage (node c in this case) will follow the SENSEB clock to the negative voltage supply rail. MOSFETs 404a and 404b ensure that the sense amplifier node with the highest voltage (in this case node t) will stay near or remain at the positive supply voltage rail VPLUS. As SENSEB goes low PISOT goes high. This prevents the sensing operation from further discharging the bitlines 301 or I/O lines 306 which can then be put back in precharge.

Advantageously, by not discharging the bitlines 301 and I/O line 306 and using a dynamic sense amplifier instead of the traditional analog amplifier, all DC current from the sense amplifiers and most of the AC current from the bitlines and I/O lines are eliminated. This is very important advantage for SRAMs with I/O widths of 32, 64, 128 bits, or more.

In the dynamic sense amplifier of FIG. 4, either node t or node c will go low, but the sensing operation does not allow both nodes t and c to be low simultaneously. When the sense amplifier is in precharge however, both nodes t and c are in the high state. This method of operation makes this sense amplifier ideally suited for driving the NAND-type SR latch comprised of gates 406 and 407.

When the sense amplifier (transistors 405a and 405b) is put into precharge, the latch formed by gates 406 and 407 retains the state set by the last active sense cycle. (In any given sense cycle node t or node c will go low setting the latch.) The latch will change state only if there is a cycle to cycle change in data state (i.e. node t low followed by node c low or vice versa). In other words, the SRAM outputs will switch only on valid data changes and will remain stable when reading a series of highs or lows. This operation is dramatically different from the unmodified SRAM of FIG. 3. In particular the AC power consumed by the output drivers is reduced by up to 50%. Output switching noise is similarly reduced from the unmodified circuitry of FIG. 3, which forces the SRAM outputs to a high state in every precharge cycle.

As soon as SENSEB has reached the low state, the sensing operation is complete and the SRAM can be returned to the precharge state. There are no output data hold time problems as the data is held in the SR latch (gates 405 and 406). The sensing operation (and hence access time) is slightly slower than the traditional (unmodified) circuit of FIG. 3 because excess delay must be added between wordline high to SENSEB low to ensure an adequate sense signal is present on the bitlines before sensing.

Although the invention has been described with reference to a specific embodiment, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed:

1. A dynamic sense amplifier for sensing data on a pair of complementary half-bitlines coupled to a static random access memory cell comprising:

first and second sensing transistors for amplifying a voltage difference between first and second sensing nodes coupled to said first and second half-bitlines during an active cycle;

first and second restore transistors for pulling said first and second half-bitlines to corresponding first and second voltage rails in response to said amplified voltage difference;

a pair of precharge transistors for selectively coupling said half-bitlines and said sensing nodes with said first voltage rail during a precharge cycle; and a pair of isolation transistors in series with said precharge transistors for selectively coupling said half-bitlines with said first voltage rail through said precharge transistors during said precharge cycle and selectively isolating said sensing nodes from said bitlines during a active cycle when a voltage difference between said sensing nodes reaches a predetermined level.

2. The sense amplifier of claim 1 and further comprising a latch coupled to an output of said sense amplifier, said latch changing state from a state of a previous active cycle when said state of said previous cycle differs from an output state of said sense amplifier.

3. The sense amplifier of claim 1 and further comprising an equalization transistor for equalizing said first and second sensing nodes during said precharge cycle.

4. The sense amplifier of claim 1 wherein said latch comprises an SR latch formed by logic gates.

5. A static random access memory sense amplifier comprising:

isolation circuitry for coupling sensing nodes of said sense amplifier with bitlines associated with said static random access memory cell during a precharge cycle and isolating said sensing nodes of said sense amplifier from said bitlines associated with said static random access memory cell during a second predetermined time period of an active cycle;

precharge circuitry for precharging said first and second sensing nodes during said precharge cycle;

sensing circuitry coupled to said sensing nodes for sensing data output from said static random access memory cell during said active cycle;

restore circuitry for restoring said data to full digital voltage levels; and an output latch for storing data from a previous active cycle, said latch changing state only when said data output from said memory differs from said data stored from a previous cycle.

6. The sense amplifier of claim 5 wherein said isolation circuitry comprises first and second transistors respectively coupling first and second half-bitlines associated with said memory cell and said sensing circuitry in response to an isolation signal.

7. The sense amplifier of claim 5 wherein said precharge circuitry comprises:

first and second transistors for selectively coupling first and second sensing nodes to a precharge voltage in response to a precharge signal; and an equalization transistor for equalizing a voltage on said first and second sensing nodes in response to said precharge signal.

8. The sense amplifier of claim 5 wherein said sensing circuitry comprises:

a first transistor having a first source/drain coupled to a first sensing node, a second source/drain coupled to a source of a sensing signal, and a gate coupled to a second sensing node; and a second transistor having a first source/drain coupled to said second sensing node, a second source/drain coupled to said source of said sensing signal, and a gate coupled to said first sensing node.

9. The sense amplifier of claim 5 wherein said restore circuitry comprises:

a first transistor having a first source/drain coupled to voltage source, a second source/drain coupled to a first sensing node, and a gate coupled to a second sensing node; and a second transistor having a first source/drain coupled to said voltage source, a second source/drain coupled to said second sensing node and a gate coupled to said first sensing node.

10. The sense amplifier of claim 5 wherein said latch comprises:

a first gate having an input coupled to a first sensing node and an output; and a second gate having an input coupled to a second sensing node, a second input coupled to an output of said first gate, and an output coupled to a second input of said first gate.

11. A memory comprising:

an array of rows and columns of static random access memory cells, each said column of cells associated with a pair of conductive half-bitlines for accessing data from a selected said row;

a sense amplifier coupled to each said pair of conductive half-bitlines, said sense amplifier comprising:

isolation circuitry for coupling sensing nodes of said sense amplifier with said half-bitlines during a precharge cycle and isolating said sensing nodes from said bitlines during an active cycle when a voltage difference between said sensing nodes reaches a predetermined level;

a first and second sensing nodes following a voltage presented on respective ones of said pair of half-bitlines during said active cycle;

precharge circuitry for precharging said first and second sensing nodes during said precharge cycle;

sensing circuitry for sensing a voltage difference appearing between said first and second sensing nodes, said voltage difference representing data;

restore circuitry for pulling said first and second sensing nodes towards selected voltage rails; and an output latch for storing data from a previous active cycle, said output latch changing state when said data differs from said data from said previous cycle.

12. The memory of claim 11 and further comprising an output driver coupled to said latch.

13. The memory of claim 11 and further comprising bitline select circuitry for selectively coupling said bitlines with said sense amplifiers.

14. A method of dynamically sensing data stored in a static random access memory cell comprising the steps of:

coupling first and second sensing nodes to a predetermined voltage in response to a precharge signal;

coupling the sense nodes with respective first and second half-bitlines coupled to the memory cell in response to an isolation signal to precharge the first and second bitlines and the first and second sensing nodes substantially simultaneously;

sensing a voltage difference between the sensing nodes, the voltage difference representing data;

isolating the first and second bitlines from the first and second sensing nodes when the voltage difference reaches a predetermined level; and presenting the data to a latch, the latch changing state when the data differ from data previously stored in the latch.

15. The method of claim 14 and further comprising the step of restoring the data sensed by the sense amplifier to full logic level voltages.

16. The method of claim 14 wherein said step of precharging comprises the substep of isolating the bitlines and the sensing nodes in response to the isolation signal.

17. The method of claim 14 wherein said step of sensing is in response to a transition to an active state of a sensing signal, the isolation signal transitioning to an active state substantially simultaneously with the transitioning of the sensing signal.

18. The method of claim 14 wherein said substep of precharging comprises the step of equalizing the first and second sensing nodes.

* * * * *